US012683354B2

(12) United States Patent
Wu et al.

(10) Patent No.: US 12,683,354 B2
(45) Date of Patent: Jul. 14, 2026

(54) LASER CHIPS ATTACHED TO A PHOTONICS CHIP BY MULTIPLE ANCHORS

(71) Applicant: GlobalFoundries U.S. Inc., Malta, NY (US)

(72) Inventors: Zhuojie Wu, Port Chester, NY (US); Koushik Ramachandran, Wappingers Falls, NY (US); Yunyao Jiang, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 555 days.

(21) Appl. No.: 18/136,404

(22) Filed: Apr. 19, 2023

(65) Prior Publication Data

US 2024/0356302 A1 Oct. 24, 2024

(51) Int. Cl.
H01S 5/0237 (2021.01)
G02B 6/12 (2006.01)

(52) U.S. Cl.
CPC .............. H01S 5/0237 (2021.01); G02B 6/12 (2013.01); *G02B 2006/12121* (2013.01)

(58) Field of Classification Search
CPC .. H01S 5/0237; H01S 5/02326; H01S 5/0233; H01S 5/0234; H01S 5/02345; H01S 5/0235; H01S 5/02375; G02B 6/12; G02B 2006/12121; G02B 6/1228; G02B 6/4238
See application file for complete search history.

(56) References Cited

U.S. PATENT DOCUMENTS 9,606,308 B2 * 3/2017 Barwicz .............. G02B 6/4232
2022/0075112 A1 3/2022 Cardile et al.
2022/0123518 A1 4/2022 He et al.

OTHER PUBLICATIONS

A. Marinins et al., "Wafer-Scale Hybrid Integration of InP DFB Lasers on Si Photonics by Flip-Chip Bonding With sub-300 nm Alignment Precision," in IEEE Journal of Selected Topics in Quantum Electronics, vol. 29, No. 3: Photon. Elec. Co-Inte. and Adv. Trans. Print., pp. 1-11, May-Jun. 2023, Art No. 8200311, doi: 10.1109/JSTQE.2022.3223641.
Yoo S, et al., "53 GBd PAM-4 fully-integrated silicon photonics transmitter with a hybrid flip-chip bonded laser." Optics Express. Nov. 7, 2022;30(23):41980-41998. doi: 10.1364/OE.474256. PMID: 36366661.
Y. Bian et al., "3D Integrated Laser Attach Technology on 300-mm Monolithic Silicon Photonics Platform," 2020 IEEE Photonics Conference (IPC), 2020, pp. 1-2, doi: 10.1109/IPC47351.2020. 9252280.

(Continued)

*Primary Examiner* — John Bedtelyon
(74) *Attorney, Agent, or Firm* — Thompson Hine LLP; Anthony Canale

(57) ABSTRACT

Structures including a photonics chip and a cavity-mounted laser chip, and methods of forming such structures. The structure comprises a photonics chip including a substrate and a cavity in the substrate, a laser chip including a body inside the cavity, a first anchor disposed inside the cavity adjacent to a first corner of the body of the laser chip, and a second anchor disposed inside the cavity adjacent to a second corner of the body of the laser chip. The first and second anchors are configured to attach the laser chip to the photonics chip.

20 Claims, 7 Drawing Sheets

(56) References Cited

OTHER PUBLICATIONS

Y. Bian et al., "Hybrid III-V laser integration on a monolithic silicon photonic platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2.

N. Fujioka, T. Chu and M. Ishizaka, "Compact and Low Power Consumption Hybrid Integrated Wavelength Tunable Laser Module Using Silicon Waveguide Resonators," in Journal of Lightwave Technology, vol. 28, No. 21, pp. 3115-3120, Nov.1, 2010, doi: 10.1109/JLT.2010.2073445.

Wu, Zhuojie at al., "PIC Structure With Wire(s) Between Z-Stop Supports on Side of Optical Device Attach Cavity." filed Sep. 19, 2022 as a U.S. Appl. No. 17/933,199.

* cited by examiner

LASER CHIPS ATTACHED TO A PHOTONICS CHIP BY MULTIPLE ANCHORS

BACKGROUND

This disclosure relates to photonics chips and, more specifically, to structures including a photonics chip and a cavity-mounted laser chip, and methods of forming such structures.

Photonics chips are used in many applications and systems including, but not limited to, data communication systems and data computation systems. A photonics chip includes a photonic integrated circuit comprised of optical components, such as modulators, polarizers, and optical couplers, that are used to manipulate light received from a light source. A laser source may be integrated with the photonics integrated circuit. For example, a laser chip may be attached to the photonics chip and may include a semiconductor laser that operates as the laser source. Light output from the semiconductor laser may be coupled to an edge coupler, which is coupled to the photonic integrated circuit.

During operation, the laser chip may experience warpage due to a temperature increase from self-heating. The warpage of the laser chip may result in mode hopping manifested in discrete jumps in the wavelength of the light that is output from the semiconductor laser. These abrupt mode hops may randomly occur in a rapid manner such that the semiconductor laser erratically switches between different wavelengths. The warpage may also result in misalignment of the output from the laser chip with the edge coupler, which degrades the optical coupling performance. The misalignment may occur because, for example, bowing from chip warpage that lifts the facet edge at which the light is output from the semiconductor laser toward the edge coupler.

Improved structures including a photonics chip and a cavity-mounted laser chip, and improved methods of forming such structures, are needed.

SUMMARY

In an embodiment of the invention, a structure comprises a photonics chip including a substrate and a cavity in the substrate, a laser chip including a body inside the cavity, a first anchor disposed inside the cavity adjacent to a first corner of the body of the laser chip, and a second anchor disposed inside the cavity adjacent to a second corner of the body of the laser chip. The first anchor and the second anchor are configured to attach the laser chip to the photonics chip.

In an embodiment of the invention, a method comprises forming a cavity in a substrate of a photonics chip, and forming a first anchor and a second anchor that are disposed inside the cavity. A laser chip includes a body disposed inside the cavity, the first anchor is disposed adjacent to a first corner of the body of the laser chip, the second anchor is disposed adjacent to a second corner of the body of the laser chip, and the first anchor and the second anchor are configured to attach the laser chip to the photonics chip.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figures 1, 2:
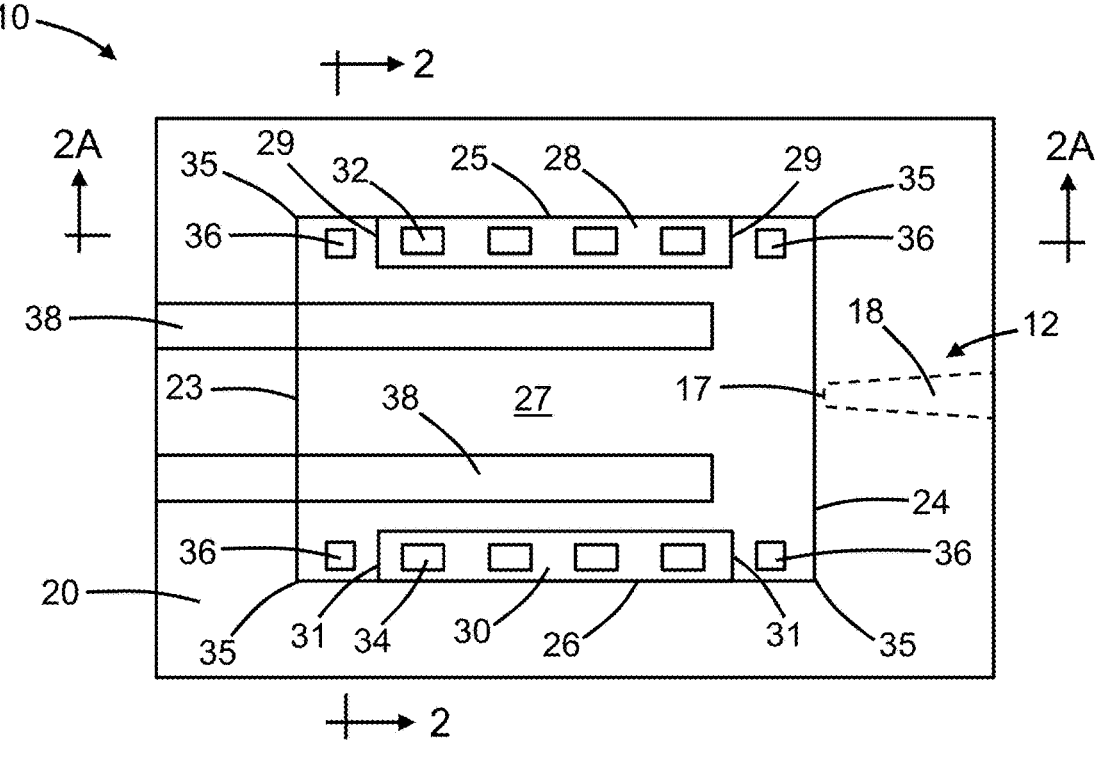
FIG. 1 is a top view of a structure at an initial fabrication stage of a processing method in accordance with embodiments of the invention.
FIG. 2 is a cross-sectional view taken generally along line 2-2 in FIG. 1.
Figure 2A:
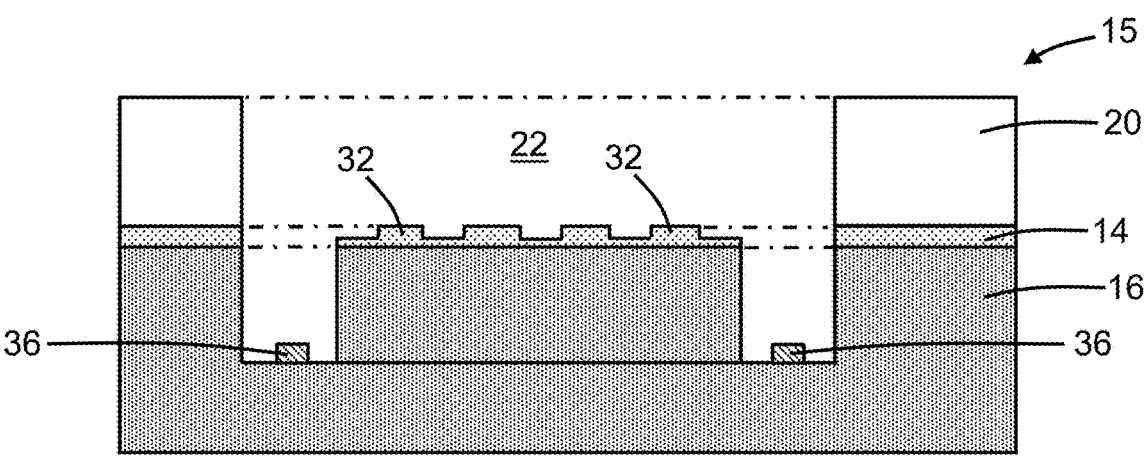
FIG. 2A is a cross-sectional view taken generally along line 2A-2A in FIG. 1.

With reference to FIGS. 1, 2, 2A and in accordance with embodiments of the invention, a structure 10 includes a waveguide core 12 that is positioned on, and over, a dielectric layer 14 and a substrate 16 of a photonics chip 15. In an embodiment, the dielectric layer 14 may be comprised of a dielectric material, such as silicon dioxide, and the substrate 16 may be comprised of a semiconductor material, such as single-crystal silicon. In an embodiment, the dielectric layer 14 may be a buried oxide layer of a silicon-on-insulator substrate, and the dielectric layer 14 may separate the waveguide core 12 from the substrate 16. In an alternative embodiment, one or more additional dielectric layers comprised of, for example, silicon dioxide may be positioned between the waveguide core 12 and the dielectric layer 14.

The waveguide core 12 may be comprised of a material having a refractive index that is greater than the refractive index of silicon dioxide. In an embodiment, the waveguide core 12 may be comprised of a semiconductor material, such as single-crystal silicon or polysilicon. In an alternative embodiment, the waveguide core 12 may be comprised of a dielectric material, such as silicon nitride, silicon oxynitride, or aluminum nitride.

The waveguide core 12 may be formed by patterning a layer of its constituent material with lithography and etching processes. In an embodiment, an etch mask may be formed by a lithography process over the layer, and unmasked sections of the deposited layer may be etched and removed by an etching process. The shape of the etch mask may determine the patterned shape of the waveguide core 12. In an embodiment, the waveguide core 12 may be formed by patterning the semiconductor material (e.g., single-crystal silicon) of a device layer of a silicon-on-insulator substrate.

The waveguide core 12 is an optical component of a photonic integrated circuit of a photonics chip 15. The waveguide core 12 may include a tapered section 18 that defines an edge coupler configured to receive light of a given mode from a light source, such as a semiconductor laser. The tapered section 18 may have a narrow end 17 defining a facet that is eventually arranged proximate to the light source and a wide end that is connected to another section of the waveguide core 12 used to route the light to the photonic integrated circuit of the photonics chip 15. The gradually-varying cross-section area of the tapered section 18 may support mode transformation and mode size variation associated with mode conversion when receiving light from the light source.

An interconnect structure 20 of the photonics chip 15 may be formed by middle-of-line processing and back-end-of-line processing over the dielectric layer 14 and substrate 16. The interconnect structure 20 may include multiple dielectric layers that are comprised of dielectric materials, such as silicon dioxide, silicon nitride, tetraethylorthosilicate silicon dioxide, or fluorinated-tetraethylorthosilicate silicon dioxide, and that are arranged in a layer stack on the dielectric layer 14 and substrate 16. The waveguide core 12 may be embedded in one or more of the dielectric layers of the interconnect structure 20.

A cavity 22 is formed that penetrates through the interconnect structure 20 and dielectric layer 14 into the substrate 16. The portion of the cavity 22 in the substrate 16 includes sidewalls 23, 24, sidewalls 25, 26, and a bottom 27 surrounded by the sidewalls 23, 24 and sidewalls 25, 26. A ledge 28 disposed inside the cavity 22 adjacent to the sidewall 25, and a ledge 30 is disposed inside the cavity adjacent to the sidewall 26. The cavity 22 and ledges 28, 30 may be formed by multiple lithography and etching processes. The narrow end 17 of the tapered section 18 of the waveguide core 12 is positioned adjacent to the sidewall 24. The ledge 28 terminates at opposite ends 29, and the ledge 30 terminates at opposite ends 31. The ledges 28, 30 only extend over a portion of the distance between the sidewall 23 and the sidewall 24 of the cavity, which differs from conventional ledges that extend over the full distance between comparable cavity sidewalls.

Mechanical stops 32 project upwardly away from the ledge 28, and mechanical stops 34 project upwardly away from the ledge 30. The mechanical stops 32 may be arranged in a row on the ledge 28, and the row of mechanical stops 32 may extend parallel to the sidewall 25. The mechanical stops 34 may be arranged in a row on the ledge 30, and the row of mechanical stops 34 may extends parallel to the sidewall 26. The mechanical stops 32, 34 may include, for example, patterned portions of the dielectric layer 14. The mechanical stops 32, 34 on the ledges 28, 30 are positioned at a shallower depth inside the cavity 22 than the bottom 27 of the cavity 22.

The sidewalls 23, 24 and sidewalls 25, 26 may intersect to define corners 35 of the cavity 22. A bond pad 36 is disposed in each extension region adjacent to one of the corners 35 of the cavity 22. In an embodiment, the cavity 22 may include four corners 35, and one of the bond pads 36 may be stationed in each corner 35. The termination of the ledge 28 at the opposite ends 29 and the termination of the ledge 30 at the opposite ends 31 provide the spaces at the corners 35 for the placement of the bond pads 36. Each redistribution layer 38 includes a portion on the bottom 27 of the cavity 22 and another portion that extends up the sidewall 23 and onto a surface of the interconnect structure 20 adjacent to the cavity 22. The bond pads 36 and redistribution layers 38 may be comprised of a patterned metal, such as gold or copper patterned by lithography and etching processes. The bond pads 36 and the redistribution layers 38 are arranged at the same elevation at the bottom 27 of the cavity 22, and at a different elevation inside the cavity from the mechanical stops 32, 34. The redistribution layers 38 may facilitate electrical interconnections to a discrete electronic device, such as a subsequently-added laser chip, placed inside the cavity 22, whereas the bond pads 36 may facilitate thermal conduction.

Figure 3:
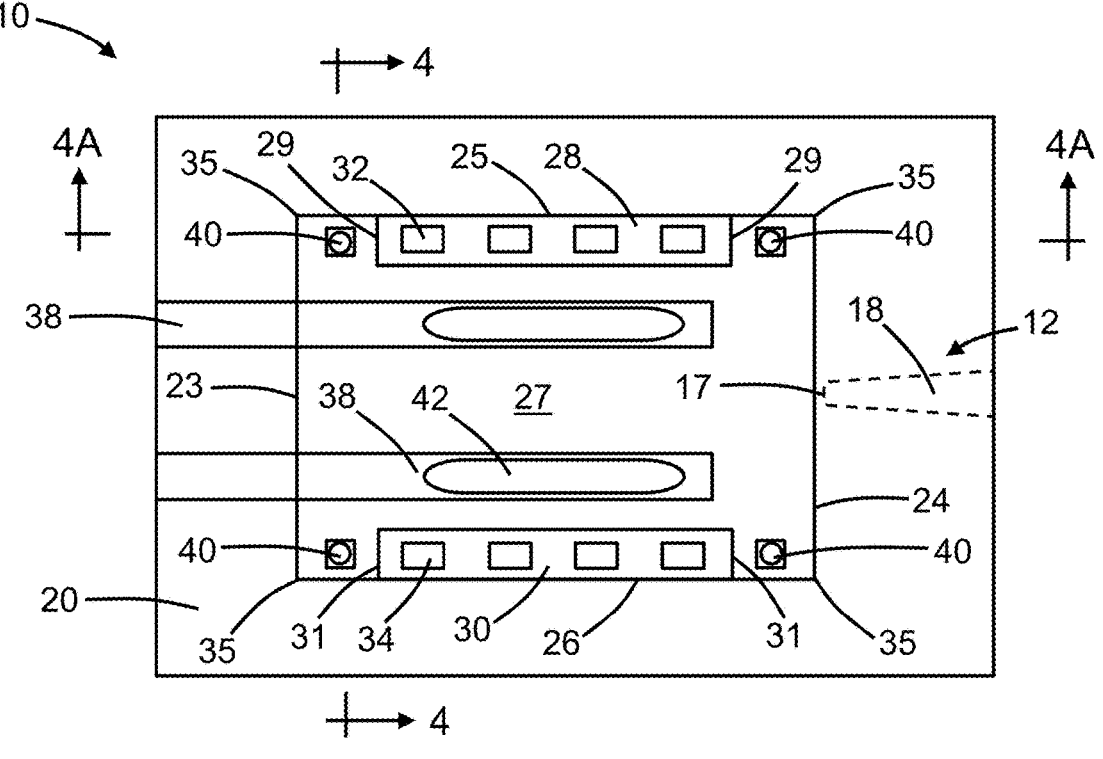
FIG. 3 is a top view of the structure at a fabrication stage subsequent to FIG. 1.
Figure 4:
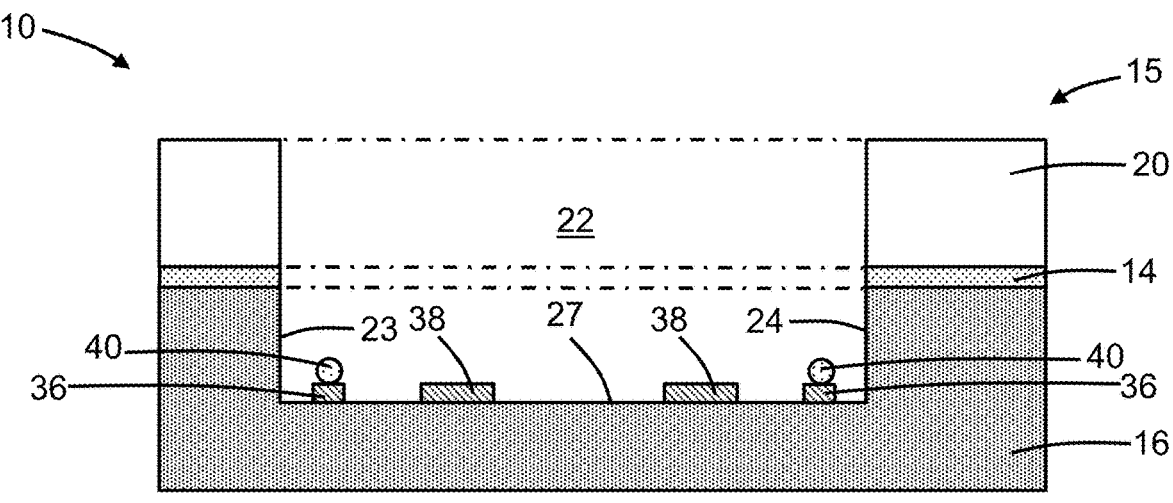
FIG. 4 is a cross-sectional view taken generally along line 4-4 in FIG. 3.
Figure 4A:
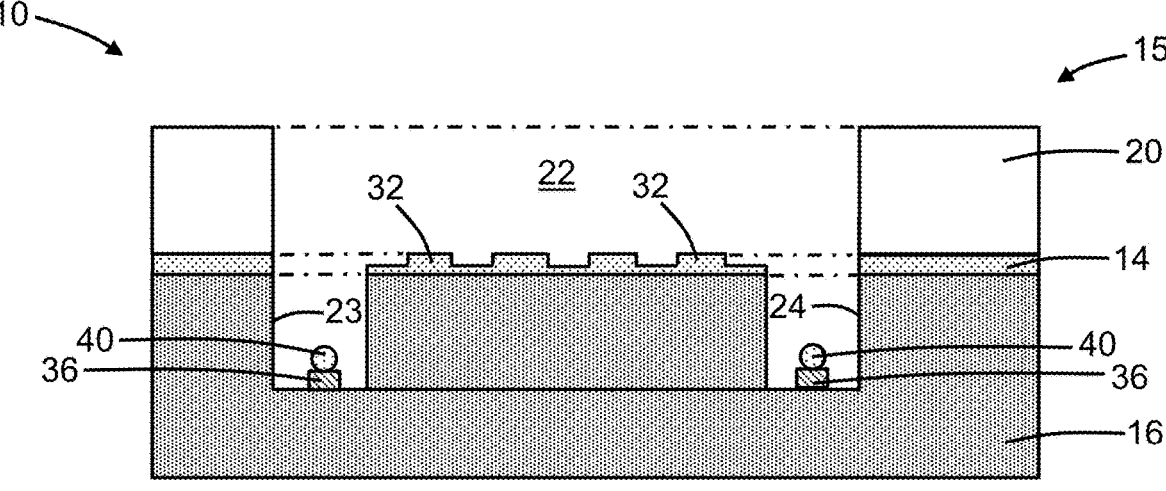
FIG. 4A is a cross-sectional view taken generally along line 4A-4A in FIG. 3.
Figure 5:
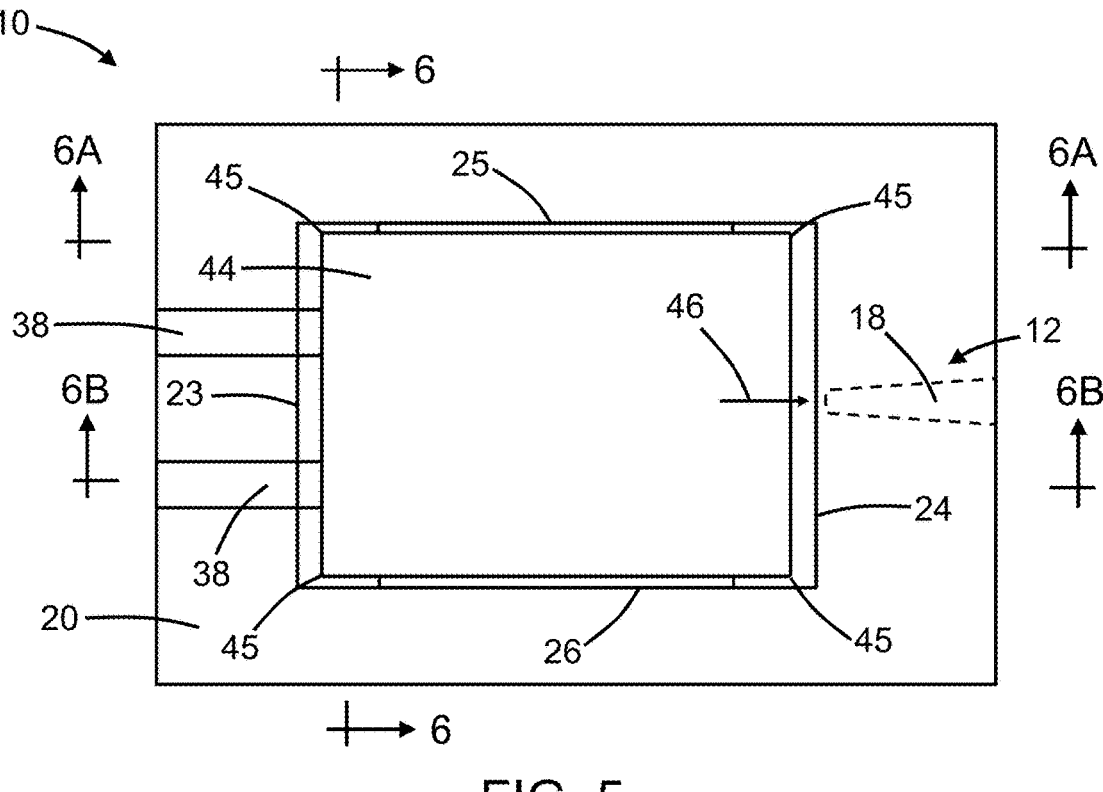
FIG. 5 is a top view of the structure at a fabrication stage subsequent to FIG. 3.

With reference to FIGS. 3, 4, 4A in which like reference numerals refer to like features in FIGS. 1, 2, 2A and at a subsequent fabrication stage, solder bumps 40 are formed on the bond pads 36, and solder bumps 42 are formed on the redistribution layers 38. The solder bumps 40, 42 may be comprised of a gold-tin alloy or another metal. The solder bumps 40 are co-located with the bond pads 36 in the corners 35 of the cavity 22. The solder bumps 42 are disposed on the redistribution layers 38 between the inner side of the ledge 28 and the inner side of the ledge 30. In an embodiment, the solder bumps 42 may be solid strips that are larger than the solder bumps 40. In an embodiment, the solder bump 42 on each redistribution layer 38 may be broken into multiple individual bumps. In an embodiment, the solder bumps 42 may be disposed on the redistribution layers 38 between the ends 29 of the ledge 28 and between the ends 31 of the ledge 30. In an embodiment, the solder bumps 40 and the solder bumps 42 may have approximately equal heights H1.

With reference to FIGS. 5, 6, 6A, 6B in which like reference numerals refer to like features in FIGS. 3, 4, 4A and at a subsequent fabrication stage, a laser chip 44 may be disposed inside the cavity 22. The shape and dimensions of the cavity 22 may be correlated with the shape and dimensions of the laser chip 44 such that the laser chip 44 can be inserted into the cavity 22. In that regard, the dimensions of the cavity 22 may be slightly greater than the dimensions of the laser chip 44 to provide clearance for insertion of the laser chip 44 into the cavity 22.

The laser chip 44 may be configured to emit light (e.g., laser light) of a given wavelength, intensity, mode shape, and mode size from a light output, diagrammatically indicated by the single-headed arrow 46, at a facet edge of the laser chip 44. In an embodiment, the laser chip 44 may include a semiconductor laser comprised of one or more III-V compound semiconductor materials. In an embodiment, the laser chip 44 may include an indium phosphide/indium-gallium-arsenic phosphide laser that is configured to generate continuous laser light in an infrared wavelength range for emission from the light output 46. In an embodiment, the tapered section 18 of the waveguide core 12, which defines the edge coupler in the structure 10, may be positioned at an edge of the cavity 22 adjacent to the light output 46 of the laser chip 44. The light output 46 from the laser chip 44 may be aligned with the terminating end 17 of the tapered section 18 of the waveguide core 12 in order to promote efficient light transfer.

The laser chip 44 has a body 48 with a lower surface 50 and corners 45. The laser chip 44 may have the form of a flip-chip package that includes bond pads 52 and bond pads 54 that are exposed at the lower surface 50. The bond pads 52, 54 may be comprised of a metal, such as gold. The bond pads 54 may be electrically connected to the semiconductor laser inside the body 48 of the laser chip 44. The bond pads 52 may contact the solder bumps 40 on the bond pads 36, and the bond pads 54 may contact the solder bumps 42 on the redistribution layers 38. The bond pads 52 may be attached to the bond pads 36 by reflowing the solder bumps 40 to provide mechanical attachments between the photonics chip 15 and the laser chip 44. The bond pads 54 may be attached to the redistribution layers 38 by reflowing the solder bumps 42 to provide mechanical and electrical connections between the photonics chip 15 and the laser chip 44.

The body 48 of the laser chip 44 may include notches 49 that are arranged adjacent to the sidewalls 25, 26 of the cavity 22. Each of the ledges 28, 30 includes an upper portion that is arranged inside one of the notches 49. The body 48 of the laser chip 48 inside the notches 49 may contact the mechanical stops 32, 34 on the ledges 28, 30 after the solder bumps 40, 42 are reflowed to attach the laser chip 44 to the photonics chip 15. The depth of the notches 49 is selected to enable the bond pads 52 to be attached to the bond pads 36 when the solder bumps 40 are reflowed and collapse and the bond pads 54 to be attached to the redistribution layers 38 when the solder bumps 42 are reflowed and collapse.

Each combination of bond pad 36, reflowed solder bump 40, and bond pad 52 defines an anchor between the photonics chip 15 and the laser chip 44. Each anchor is arranged adjacent to one of the corners 45 of the body 48 of the laser chip 44 and one of the corners 35 of the cavity 22. The anchors may be effective to constrain and potentially alleviate warpage of the laser chip 44, when heated during operation, by mechanically securing the corners 45 of the laser chip 44 to the photonics chip 15. In contrast to the anchors, the mechanical stops 32, 34 passively control vertical positioning without any attachments between the laser chip 44 and the photonics chip 15. The solder bumps 42, which also attach the laser chip 44 to the photonics chip 15, are not arranged at the corners 35 of the cavity 22. Shortening the length of the solder bumps 42 displaces these attachments between the photonics chip 15 and laser chip 44 further away from the sidewalls 23, 24 than is conventional, which may further reduce the susceptibility to warpage.

In an alternative embodiment, all or part of each anchor may include a different material instead of the solder of the solder bump 40. In an alternative embodiment, the reflowed solder bump 40 may be replaced by an adhesive bump that includes an amount of adhesive, or another bonding agent, disposed between the bond pad 36 and the bond pad 52 of each anchor.

Figure 7:
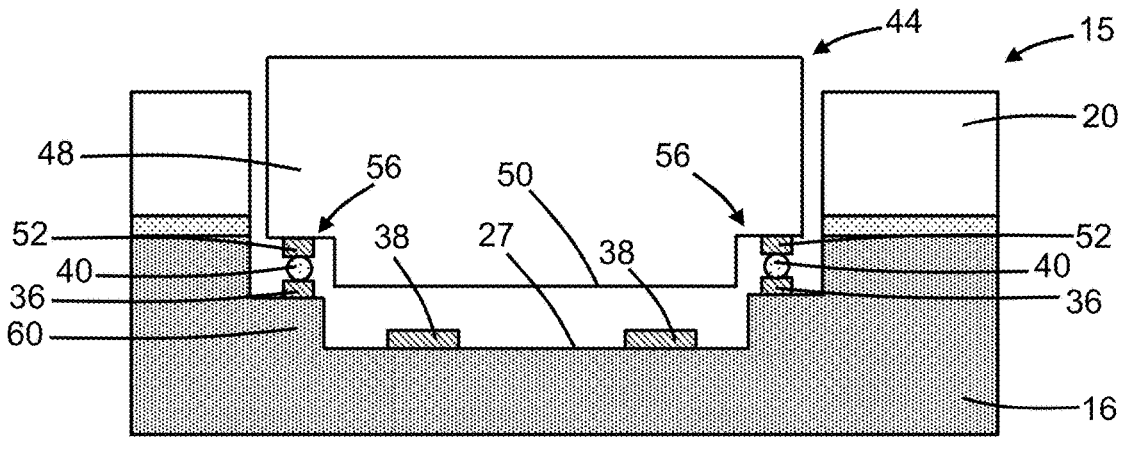
FIG. 7 is a cross-sectional view of a structure in accordance with alternative embodiments of the invention.

With reference to FIG. 7 and in accordance with alternative embodiments, the anchors defined by each combination of bond pad 36, reflowed solder bump 40, and bond pad 52 may be disposed at a different level inside the cavity 20 than each combination of redistribution layer 38, reflowed solder bump 42, and bond pad 54. In an embodiment, the cavity 22 may be modified to include columns 60 that are arranged in the corners 35. The columns 60 project upwardly away from the bottom 27 of the cavity 22. In an embodiment, one of the columns 60 may be arranged in each corner 35 adjacent to the opposite ends 29 of the ledge 28 (FIG. 1) and the opposite ends 31 of the ledge 30 (FIG. 1). In an embodiment, the bond pads 36 on the columns 60 may be disposed at a level that is, in elevation, between the level of the ledges 28, 30 and the bottom 27 of the cavity 22.

The bond pad 36 and solder bump 40 of each anchor is disposed on one of the columns 60 between the photonics chip 15 and the corresponding bond pad 52 on the laser chip 44. The lower surface 50 of the laser chip 44 may be modified to include recesses 56, the bond pads 52 may be located inside the recesses 56, and at least a portion of the solder bump of each anchor may be received in one of the recesses 56 for attachment to the corresponding bond pad 52 when the laser chip 44 is attached to the photonics chip 15.

Figure 6:
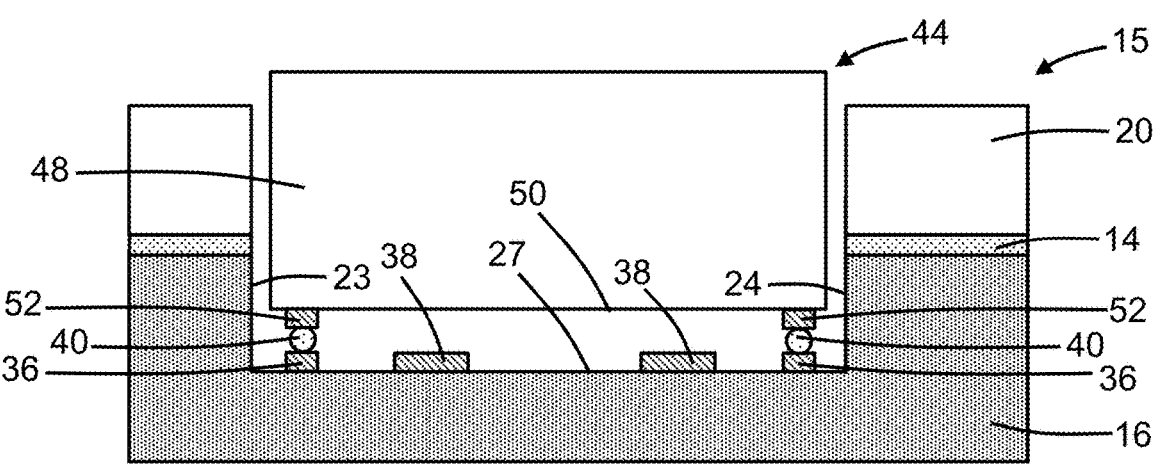
FIG. 6 is a cross-sectional view taken generally along line 6-6 in FIG. 5.
Figure 6A:
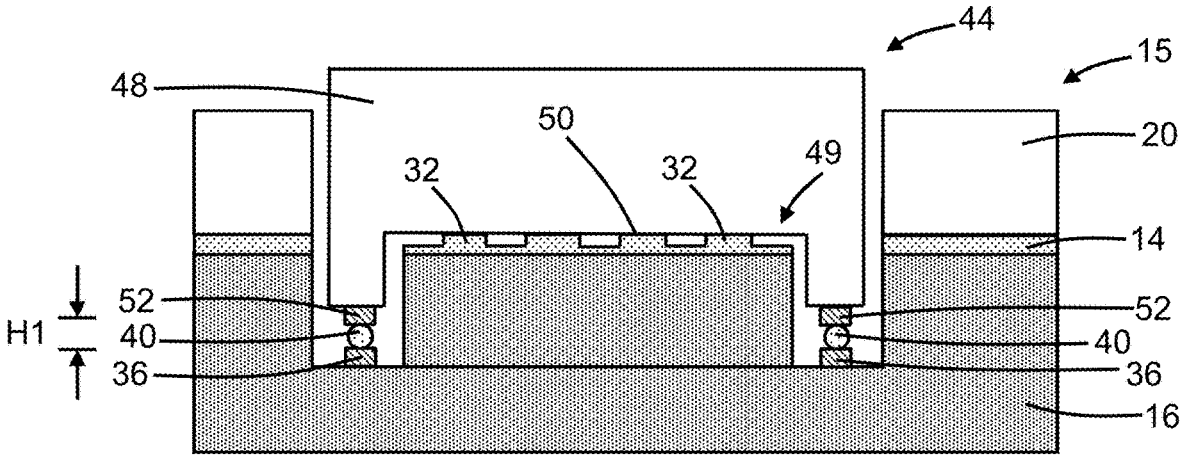
FIG. 6A is a cross-sectional view taken generally along line 6A-6A in FIG. 5.
Figure 6B:
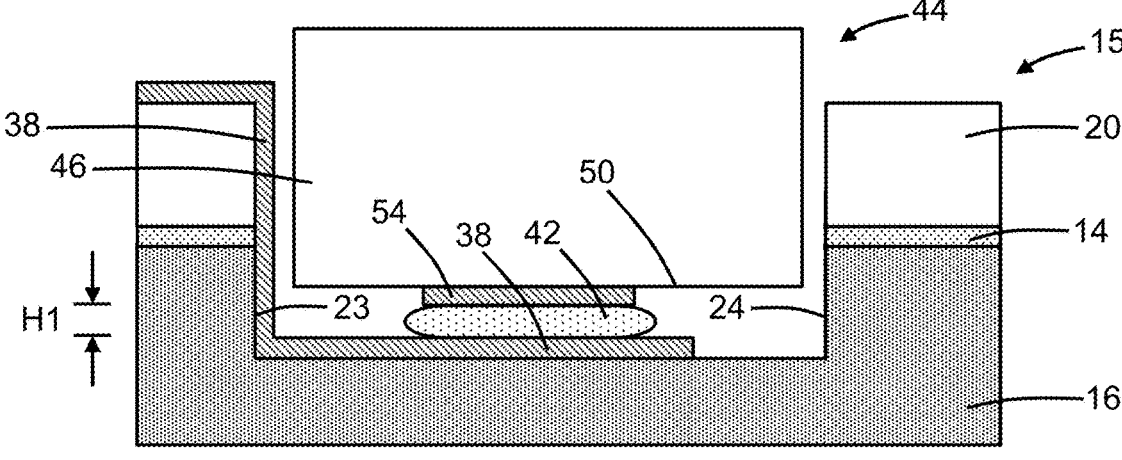
FIG. 6B is a cross-sectional view taken generally along line 6B-6B in FIG. 5.
Figure 8:
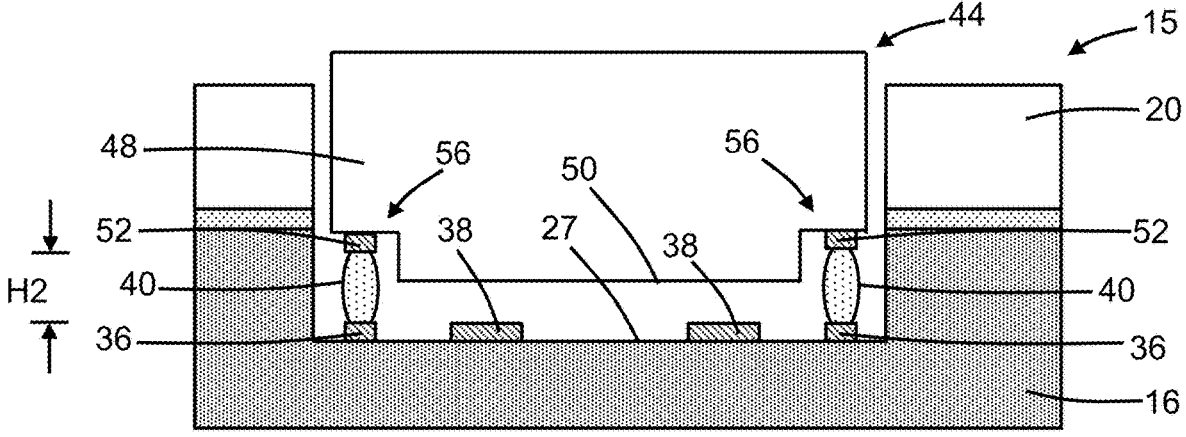
FIG. 8 is a cross-sectional view of a structure in accordance with alternative embodiments of the invention.

With reference to FIG. 8 and in accordance with alternative embodiments, the solder bumps 40 of the anchors may be increased in height such that, after the solder bumps 40 are reflowed, the bond pads 52 on the laser chip 44 are elevated relative to the bond pads 54 (FIG. 6B) on the laser chip 44. In an embodiment, the solder bumps 40 may have a height H2 that is greater than the height H1 of the solder bumps 42 (FIG. 6B). The anchors are effectively increased in height by the height increase of the solder bumps 40. The solder bumps 42 are not increased in height in conjunction with the heightening of the solder bumps 40. The recesses 56 at the corners 45 of the laser chip 44 receive at least a portion of the heightened solder bumps 40 when the laser chip 44 is attached to the photonics chip 15.

Figure 9:
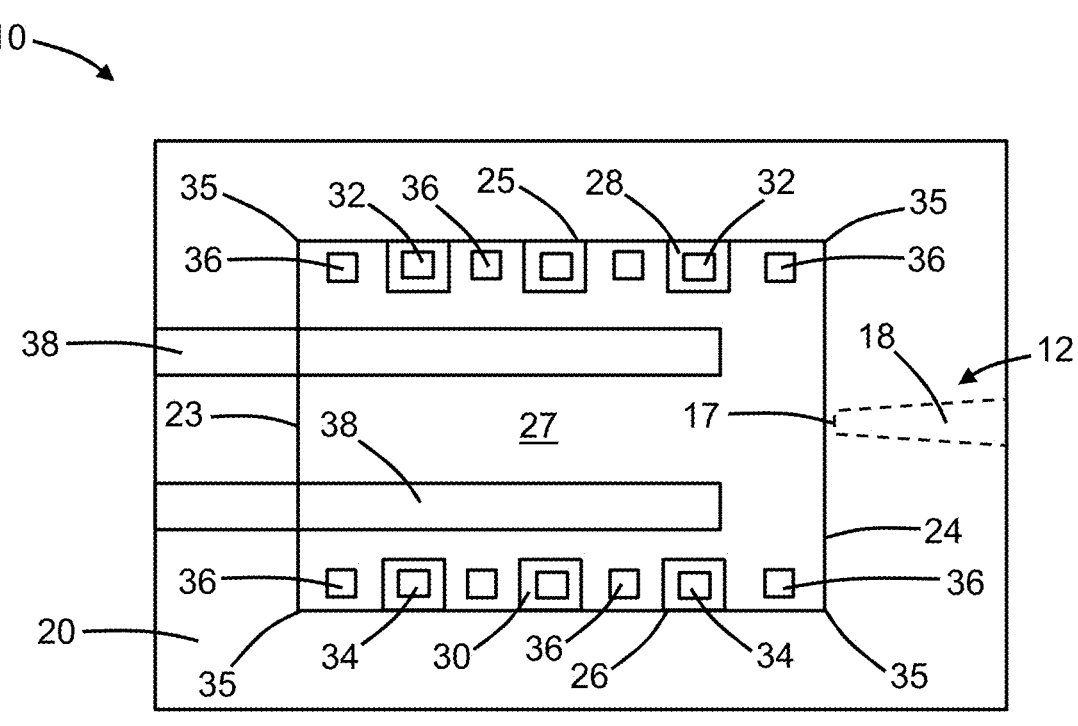
FIG. 9 is a top view of a structure in accordance with alternative embodiments of the invention.

With reference to FIG. 9 and in accordance with alternative embodiments, multiple ledges 28 may be disposed adjacent to the sidewall 25, and multiple ledges 30 may be disposed adjacent to the sidewall 26. Each ledge 28 may include one or more of the mechanical stops 32, and each ledge 30 may include one or more of the mechanical stops 34. Additional bond pads 36 may be disposed in the spaces between adjacent pairs of the ledges 28 and in the spaces between adjacent pairs of the ledges 30. One of the solder bumps 40 (FIG. 3) is disposed on each additional bond pad 36. After reflowing the solder bumps 40, additional anchors are formed at locations other than the corners 35 of the cavity 22 and, more specifically, additional anchors are formed at locations along the sidewalls 25, 26 between the corners 35 and the corresponding corners 45 of the laser chip 44. The laser chip 44 is modified to include additional bond pads 52 that are joined by the reflowed solder bumps 40 in order to generate the additional anchors. The additional anchors and mechanical stops 32 alternate along the length of the sidewall 25, and additional anchors and mechanical stops 32 also alternate along the length of the sidewall 26.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a photonics chip including a substrate and a cavity in the substrate, the cavity including a bottom inside the substrate and a sidewall, and the substrate including a first ledge that projects away from the bottom of the cavity;
a redistribution layer with a first portion on the bottom of the cavity adjacent to the first ledge and a second portion on the sidewall of the cavity, the redistribution layer comprising a metal;
a plurality of mechanical stops that project away from the first ledge;
a laser chip including a body inside the cavity, the body having a first corner and a second corner;
a first anchor disposed inside the cavity adjacent to the first corner of the body of the laser chip; and
a second anchor disposed inside the cavity adjacent to the second corner of the body of the laser chip,
wherein the first anchor and the second anchor are configured to attach the laser chip to the photonics chip, and the first ledge is arranged between the first anchor in the first corner and the second anchor in the second corner.

2. The structure of claim 1 wherein the photonics chip includes an edge coupler adjacent to the sidewall of the cavity.

3. The structure of claim 2 wherein the laser chip includes a light output, and the laser chip is configured to emit light from the light output toward the edge coupler.

4. The structure of claim 1 wherein the first anchor comprises a first solder bump, and the second anchor comprises a second solder bump.

5. The structure of claim 4 wherein the first anchor further includes a first bond pad on the photonics chip and a first bond pad on the laser chip that is attached by the first solder bump to the first bond pad on the photonics chip, and the second anchor further includes a second bond pad on the photonics chip and a second bond pad on the laser chip that is attached by the second solder bump to the second bond pad on the photonics chip.

6. The structure of claim 1 wherein the first anchor comprises a first adhesive bump, and the second anchor comprises a second adhesive bump.

7. The structure of claim 6 wherein the first anchor further includes a first bond pad on the photonics chip and a first bond pad on the laser chip that is attached by the first adhesive bump to the first bond pad on the photonics chip, and the second anchor further includes a second bond pad on the photonics chip and a second bond pad on the laser chip that is attached by the second adhesive bump to the second bond pad on the photonics chip.

8. The structure of claim 1 wherein the substrate includes a column in the first corner that extends away from the bottom of the cavity, and the first anchor is disposed between the column and the body of the laser chip.

9. The structure of claim 8 wherein the laser chip includes a recess, the first anchor includes a bond pad on the laser chip, and the bond pad is arranged inside the recess.

10. The structure of claim 9 wherein the first anchor includes a solder bump and a bond pad on the column of the substrate, and the solder bump is disposed between the bond pad on the laser chip and the bond pad on the column of the substrate.

11. The structure of claim 1 wherein the first ledge includes a first end adjacent to the first anchor in the first corner and a second end adjacent to the second anchor in the second corner, and the body of the laser chip includes a portion between the first corner and the second corner that contacts the mechanical stops.

12. The structure of claim 11 wherein the photonics chip includes an edge coupler adjacent to the sidewall, and the first anchor in the first corner is disposed between the sidewall and the first end of the first ledge.

13. The structure of claim 12 further comprising:
a third anchor disposed inside the cavity between the first anchor and the second anchor,
wherein the third anchor is configured to attach the laser chip to the photonics chip, the substrate includes a second ledge that projects away from the bottom of the cavity, and the third anchor is disposed along the sidewall between the first ledge and the second ledge.

14. The structure of claim 11 further comprising:
a solder bump on the portion of the redistribution layer, the solder bump arranged between the first end of the first ledge and the second end of the first ledge.

15. The structure of claim 1 wherein the body of the laser chip includes a notch, and the first ledge includes a portion disposed inside the notch in the body of the laser chip.

16. The structure of claim 1 wherein the cavity in the substrate includes a first corner and a second corner, the first corner of the cavity is adjacent to the first anchor in the first corner of the laser chip, and the second corner is adjacent to the second anchor in the second corner of the laser chip.

17. The structure of claim 1 wherein the first anchor includes a first solder bump having a first height, and further comprising:
a second solder bump on the first portion of the redistribution layer, the second solder bump having a second height that is less than the first height.

18. The structure of claim 17 wherein the laser chip includes a recess, the first anchor includes a bond pad on the laser chip, and the bond pad and a portion of the first solder bump are arranged inside the recess.

19. The structure of claim 1 wherein the photonics chip includes an interconnect structure on the substrate, the interconnect structure has a surface adjacent to the cavity, and the second portion of the redistribution layer extends onto the surface of the interconnect structure.

20. A method comprising:

forming a cavity in a substrate of a photonics chip, wherein the cavity includes a bottom inside the substrate and a sidewall, and the substrate includes a ledge that projects away from the bottom of the cavity;

forming a redistribution layer with a first portion on the bottom of the cavity adjacent to the ledge and a second portion on the sidewall of the cavity, wherein the redistribution layer comprises a metal;

forming a plurality of mechanical stops that project away from the ledge; and forming a first anchor and a second anchor that are disposed inside the cavity, wherein a laser chip includes a body disposed inside the cavity, the first anchor is disposed adjacent to a first corner of the body of the laser chip, the second anchor is disposed adjacent to a second corner of the body of the laser chip, and the first anchor and the second anchor are configured to attach the laser chip to the photonics chip.

* * * * *